United States Patent [19]
Takaishi

[11] Patent Number: 5,973,343
[45] Date of Patent: *Oct. 26, 1999

[54] SEMICONDUCTOR MEMORY DEVICE HAVING BIT LINE DIRECTLY HELD IN CONTACT THROUGH CONTACT WITH IMPURITY REGION IN SELF-ALIGNED MANNER AND PROCESS OF FABRICATION THEREOF

[75] Inventor: Yoshihiro Takaishi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/634,385

[22] Filed: Apr. 18, 1996

[30] Foreign Application Priority Data

Apr. 20, 1995 [JP] Japan ................................. 7-095299

[51] Int. Cl.⁶ ........................... H01L 27/108; H01L 29/76
[52] U.S. Cl. ........................... 257/296; 257/298; 257/306
[58] Field of Search ..................... 257/296, 297, 257/298, 299, 300, 306, 307, 308, 309, 310

[56] References Cited

U.S. PATENT DOCUMENTS

| | | | |
|---|---|---|---|
| 5,091,761 | 2/1992 | Hiraiwa et al. | 257/306 |
| 5,153,689 | 10/1992 | Okumura et al. | 257/306 |
| 5,158,905 | 10/1992 | Ahn | 257/310 |
| 5,237,187 | 8/1993 | Suwanai et al. | 257/296 |
| 5,396,094 | 3/1995 | Matsuo | 257/310 |
| 5,486,712 | 1/1996 | Arima | 257/306 |

FOREIGN PATENT DOCUMENTS

| | | |
|---|---|---|
| 62-224068 | 10/1987 | Japan . |
| 63-281457 | 11/1988 | Japan . |
| 3-102869 | 4/1991 | Japan . |
| 4-12562 | 1/1992 | Japan . |
| 4-14869 | 1/1992 | Japan . |
| 4-97565 | 3/1992 | Japan . |
| 5-110018 | 4/1993 | Japan . |

*Primary Examiner*—David B. Hardy
*Assistant Examiner*—George C. Eckert, II
*Attorney, Agent, or Firm*—Sughrue, Mion, Zinn, Macpeak & Seas, PLLC

[57] ABSTRACT

Two n-channel enhancement type switching transistors are fabricated on an active area in such a manner as to share a common drain region, and gate electrodes are encapsulated in insulating wall structures defining a contact hole over the common drain region so as to allow a bit line to be directly held in contact through the contact hole with the common drain region.

17 Claims, 13 Drawing Sheets

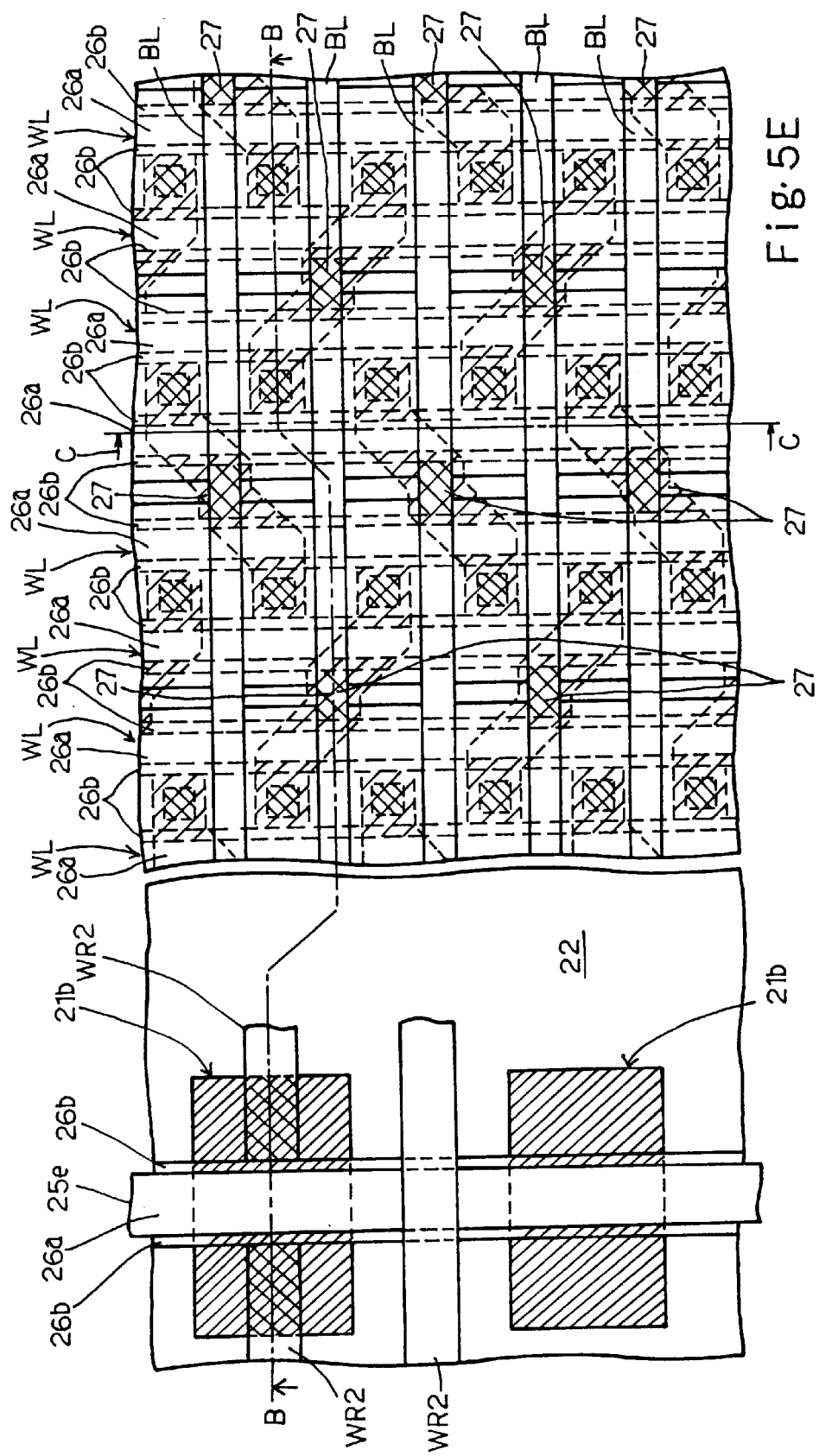

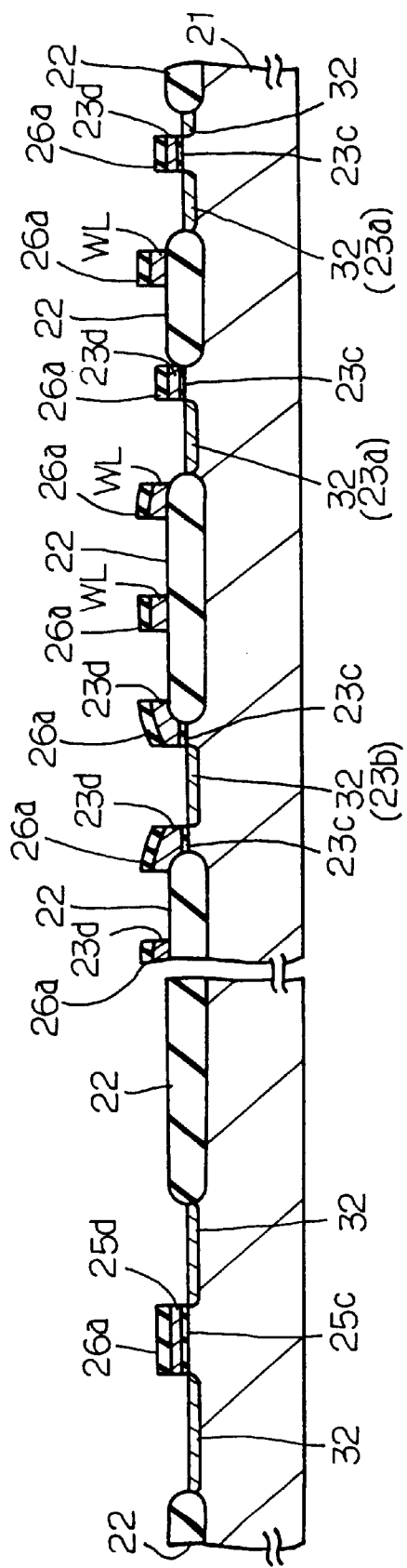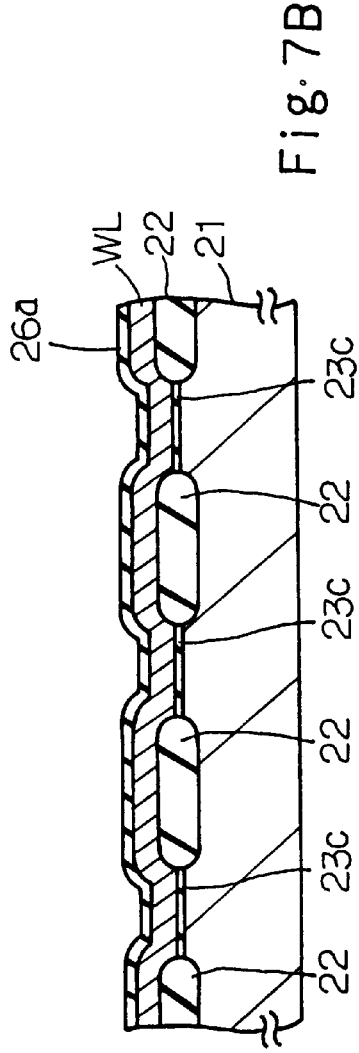

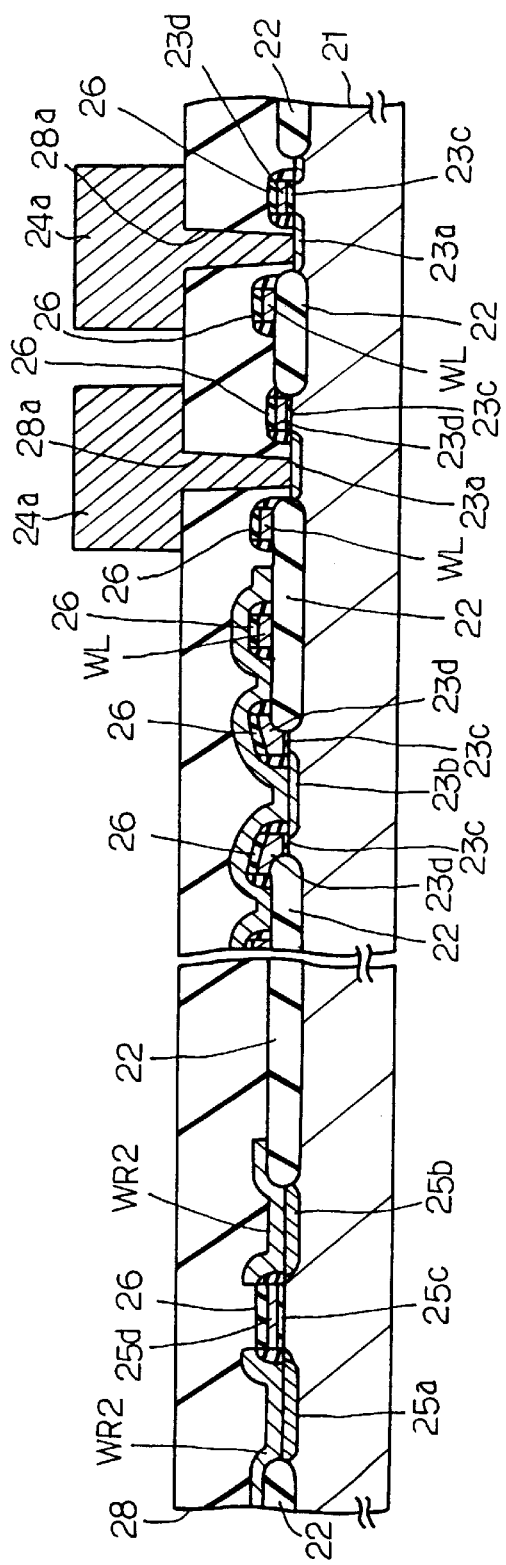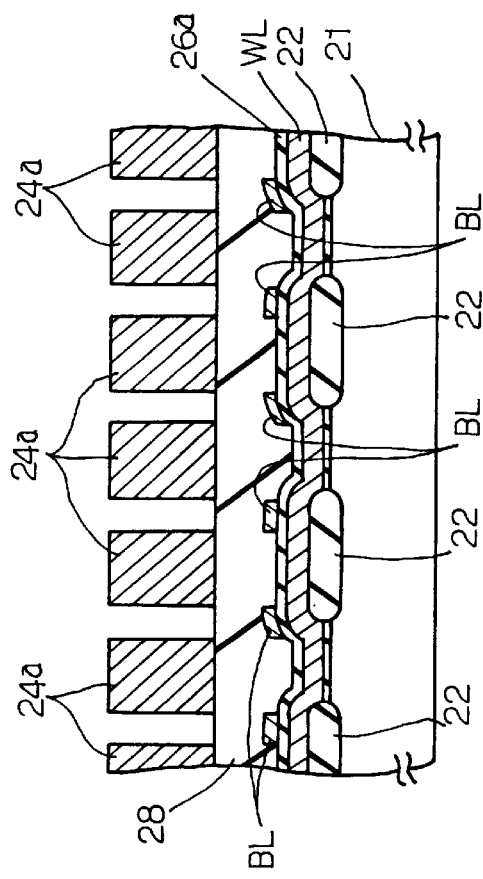

5,973,343

SEMICONDUCTOR MEMORY DEVICE HAVING BIT LINE DIRECTLY HELD IN CONTACT THROUGH CONTACT WITH IMPURITY REGION IN SELF-ALIGNED MANNER AND PROCESS OF FABRICATION THEREOF

FIELD OF THE INVENTION

This invention relates to a semiconductor memory device and, more particularly, to a semiconductor memory device having a bit line directly held in contact through a small contact with an impurity region in a self-aligned manner and a process of fabrication thereof.

DESCRIPTION OF THE RELATED ART

A semiconductor ultra large-scale integration has a multiply laminated structure, and conductive patterns and insulating patterns are laminated on a semiconductor substrate. Conductive patterns on different levels are electrically connected through a contact hole, and the contact hole is miniaturized together with the conductive patterns.

A dynamic random access memory device is a typical example of the semiconductor ultra large scale integration, and FIG. 1 illustrates the prior art dynamic random access memory cell.

The prior art dynamic random access memory cell is fabricated on a p-type silicon substrate 1, and a field oxide layer 2 is selectively grown on the p-type silicon substrate 1. The field oxide layer 2 defines an active area assigned to a pair of dynamic random access memory cells M1 and M2. The dynamic random access memory cells M1 and M2 are identical in structure with one another.

N-type source regions 3a/3b and an n-type common drain region 3c are formed in the active area at intervals, and gate oxide layers 4a and 4b are grown on the channel areas between the n-type source regions 3a and the n-type common drain region c. The gate oxide layers 4a and 4b are overlain by gate electrodes 5a and 5b, respectively, and the gate electrodes 5a and 5b form parts of word lines WL. The n-type source region 3a, the n-type common drain region 3c, the gate oxide layer 4a and the gate electrode 5a form in combination an n-channel enhancement type switching transistor SW1 and SW2.

The word lines WL are wrapped in a first inter-level insulating layer 6a, and contact holes 6b and 6c are formed in the first inter-level insulating layer 6a so as to expose the n-type source regions 3a/3b and the n-type common drain region 3c. Storage node electrodes 7a and 7b are formed on the first inter-level insulating layer 6a, and held in contact through the contact holes 6b and 6c with the n-type source regions 3a and 3b, respectively.

The storage node electrodes 7a and 7b are covered with dielectric films 8a and 8b, respectively, and cell plate electrodes 9a and 9b are opposed through the dielectric films 8a/8b to the storage node electrodes 7a and 7b. The storage node electrodes 7a/7b, the dielectric films 8a/8b and the cell plate electrodes 9a/9b form in combination stacked storage capacitors CP1 and CP2, and the n-channel enhancement type switching transistors SW1 and SW2 and the stacked storage capacitors CP1 and CP2 as a whole constitute the dynamic random access memory cells M1 ad M2.

The dynamic random access memory cells M1 and M2 are covered with a second inter-level insulating layer 10a, and a contact hole 10b is formed in the second inter-level insulating layer 10a. The n-type common drain region 3c is exposed to the contact hole 10b. A bit line BL extends over the second inter-level insulating layer 10a, and is held in contact through the contact hole 10b with the n-type common drain region 3c.

The word lines WL are selectively changed to an active high level, and the n-channel enhancement type switching transistors SW1 and SW2 selectively turn on so as to conduct the associated stacked storage capacitors CP1 and CP2 to the bit line BL.

The contact hole 10b is formed through a photolithographic process, and a nesting tolerance is necessary between the n-type common drain region 3c and the contact hole 10b. If the nesting tolerance is too small, the contact hole 10b may pass through the first inter-level insulating layer 6a so as to expose the gate electrode 5a or 5b thereto. However, the large nesting tolerance consumes a substantial amount of the active area, and impedes the scale-down of the dynamic random access memory cell M1/M2.

In order to decrease the nesting tolerance, Japanese Patent Publication of Unexamined Application No. 63-281457 discloses a structure of dynamic random access memory cell, and FIG. 2 illustrates the structure of the second dynamic random access memory cell.

A pair of dynamic random access memory cells M3 and M4 is fabricated on an active area defined by a thick field oxide layer 11 selectively grown on a p-type silicon substrate 12. The dynamic random access memory cells M3 and M4 are similar in structure to the dynamic random access memory cells M1 and M2, and the layers and the regions forming parts of the memory cells M3 and M4 are labeled with the same references as those of the memory cells M1 and M2 without detailed description.

A contact hole 6d is formed in the first inter-level insulating layer 6a, and the n-type common drain region 3c is exposed to the contact hole 6d. A conductive pad 13 is formed on the first inter-level insulating layer 6a, and is held in contact through the contact hole 6d with the n-type common drain region 3c. The top surface of the conductive pad 13 is smoothened, and partially overlapped with the gate electrodes 5a and 5b. The conductive pad 13 is covered with the second inter-level insulating layer 10a, and the bit line BL is held in contact through the contact hole 10b with the top surface of the conductive pad 13.

The prior art structure shown in FIG. 2 is fabricated as follows. The thick field oxide layer 11 is selectively grown on the p-type silicon substrate 12, and the gate oxide layers 4a and 4b are thermally grown on the active area. The word lines WL and, accordingly, gate electrodes 4a/4b are patterned from a conductive layer (not shown) such as a polysilicon layer, and lightly doped n-type regions 3aa, 3ba and 3ca are formed in the active area in a self-aligned manner with the gate electrodes 4a/4b.

The first inter-level insulating layer 6a and the contact holes 6b to 6d are formed without a mask alignment. The polysilicon word lines WL may be oxidized so as to form the first inter-level insulating layer 6a of 0.2 to 0.4 micron thick. Alternatively, a chemical vapor deposition may be available for the first inter-level insulating layer 6a. The first inter-level insulating layer 6a defines the contact holes 6b to 6d in a self-aligned manner, and is conducive to the reduction of the active area. Although the oxide is grown on the lightly doped n-type regions 3aa to 3ca during the formation of the first inter-level insulating layer 6a, the Japanese Patent Publication of Unexamined Application is silent to the removal of the oxide over the lightly doped n-type regions 3aa to 3ca.

The lightly doped n-type regions 3aa, 3ba and 3ca are partially exposed to the contact holes 6b to 6d, and exposed areas of the lightly doped n-type regions 3aa to 3ca are covered with thin oxide layers (not shown) of 10 to 20 nanometers thick. N-type dopant impurity is ion implanted into the exposed areas, and heavily doped n-type regions 3ab, 3bb and 3cb are formed in the lightly doped n-type regions 3aa, 3ba and 3ca, respectively. The lightly doped n-type regions 3aa to 3ca and the heavily doped n-type regions 3ab to 3cb form the n-type source regions 3a/3b and the n-type common drain region 3c.

The thin oxide layer is removed from the n-type common drain region 3c exposed to the contact hole 6d, and polysilicon is grown over the first inter-level insulating layer 6a by using a chemical vapor deposition. The polysilicon layer is etched back so as to form the smooth top surface. The polysilicon is patterned into the conductive pad 13. The first inter-level insulating layer 6a electrically isolates the gate electrodes 5a and 5b from the conductive pad 13, and a short-circuit never takes place between the gate electrodes 5a/5b and the conductive pad 13, because the growth of the first inter-level insulating layer 6d defines the contact hole 6a.

The storage node electrodes 7a/7b, the dielectric layers 8a/8b and the cell plate electrodes 9a/9b are successively laminated over the n-type source regions 3a and 3b, and fabricate the stacked storage capacitors M3 and M4 over the n-channel enhancement type switching transistors SW1/SW2.

Phosphosilicate glass is deposited over the entire surface, and forms the second inter-level insulating layer 10a. The contact hole 10b is formed in the second inter-level insulating layer 10a by using the lithographic techniques, and the smooth top surface is exposed to the contact hole 10b. The top smooth surface is wide enough to give a large nesting tolerance to the contact hole 10b, and the bit line BL is held in contact through the contact hole 10b with the top smooth surface.

Thus, the self-aligned contact hole 6d is formed in the first inter-level insulating layer 6a without a nesting tolerance, and makes the active area shown in FIG. 2 narrower than the active area shown in FIG. 1.

However, when the prior art dynamic random access memory device shown in FIG. 2 is further scaled down, large resistance impedes a signal propagation between the stacked storage capacitor CP1/CP2 and the bit line BL. This is because of the fact that the signal is propagated against the contact resistance between the n-type common drain region 3c and the conductive pad 13, the resistance of the conductive pad 13 and the contact resistance between the conductive pad 13 and the bit line BL. This is the first problem encountered in the prior art dynamic random access memory device shown in FIG. 2.

The second problem is the complicated fabrication process. The step of forming the conductive pad 13 is inserted between the formation of the first inter-level insulating layer 6a and the fabrication of the stacked storage capacitors CP1/CP2, and is, accordingly, additional. The complicated process decreases the production yield, and, accordingly, increases the production cost of the semiconductor dynamic random access memory device.

SUMMARY OF THE INVENTION

It is therefore an important object of the present invention to provide a semiconductor memory device which is small in contact resistance between an impurity region and a bit line without sacrifice of the occupation area.

It is also an important object of the present invention to provide a simple process of fabricating the semiconductor memory device.

To accomplish the object, the present invention proposes to form a bit line extending on an insulating layer wrapping a gate electrode and held in contact through a gap between the insulating layer and an insulating layer wrapping an adjacent gate electrode.

In accordance with one aspect of the present invention, there is provided a semiconductor memory device fabricated on a semiconductor substrate, comprising: an memory cell array including a plurality of memory cells each having a switching transistor and a storage capacitor electrically connected in series, the switching transistor having a source region formed in a first surface portion of the semiconductor substrate and electrically connected to the storage capacitor, a drain region formed in a second surface portion of the semiconductor substrate and spaced from the source region, a first gate insulating layer formed on a third surface portion of the semiconductor substrate between the source region and the drain region and a first gate structure formed on the first gate insulating layer and forming a part of a word line; a plurality of insulating wall structures each wrapping the gate structure together with the gate insulating layer, and defining contact windows each exposing the drain region; a plurality of bit lines each held in contact through one of the contact windows with the drain region; and a first inter-level insulating layer covering the insulating wall structures and the bit lines.

In accordance with another aspect of the present invention, there is provided a process of fabricating a semiconductor device, comprising the steps of: a) forming at least one first active area on a surface of a semiconductor substrate; b) forming first gate insulating layers on the first active area; c) forming a first conductive layer over the first gate insulating layer; d) forming a first insulating layer over the first conductive layer; e) patterning the first insulating layer and the first conductive layer into upper insulating walls and first gate structures overlain by the upper insulating walls, formed on the first gate insulating layers and spaced from each other; f) introducing a first dopant impurity into the first active area so as to form a source region and a common drain region in a self-aligned manner with the first gate structures; g) forming side insulating walls on both side surfaces of the first gate structures so as to respectively encapsulate the first gate structures in first insulating wall structures constituted by the upper insulating walls and the side insulating walls, the side insulating walls defining a contact window exposing the common drain region; h) forming a second conductive layer over the insulating wall structures so as to be held in contact through the conductive window with the common drain region; i) patterning the second conductive layer into a bit line; j) covering the bit line with a first inter-level insulating layer; k) fabricating a stacked storage capacitor on the first inter-level insulating layer, and having a storage node electrode held in contact through a contact hole formed in the first inter-level insulating layer with the common drain region; and l) covering the stacked storage capacitor with a second inter-level insulating layer.

BRIEF DESCRIPTION OF THE DRAWINGS

The features and advantages of the semiconductor dynamic random access memory device and the fabrication process according to the present invention will be more clearly understood from the following description taken in conjunction with the accompanying drawings in which:

FIGS. 5A to 5E are plan views showing a process sequence of fabricating the semiconductor dynamic random access memory device;

FIGS. 6A to 6E are cross sectional views taken along line B—B of FIGS. 5A to 5E; and FIGS. 7A to 7E are cross sectional views taken along line C—C of FIGS. 5A to 5E.

DESCRIPTION OF THE PREFERRED EMBODIMENT

Figure 3:
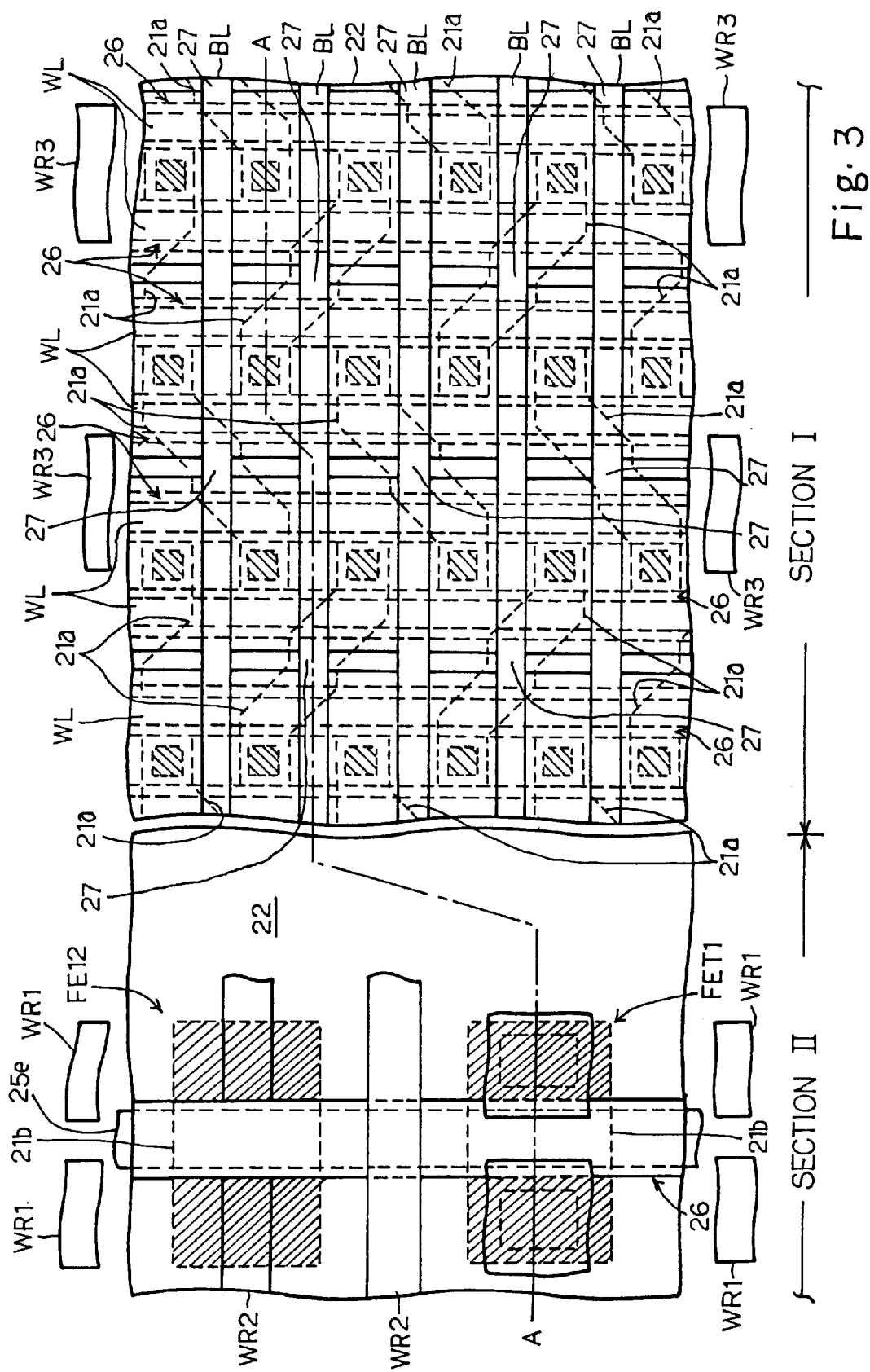
FIG. 3 is a plan view showing the layout of component elements of a semiconductor dynamic random access memory device according to the present invention.
Figure 4:
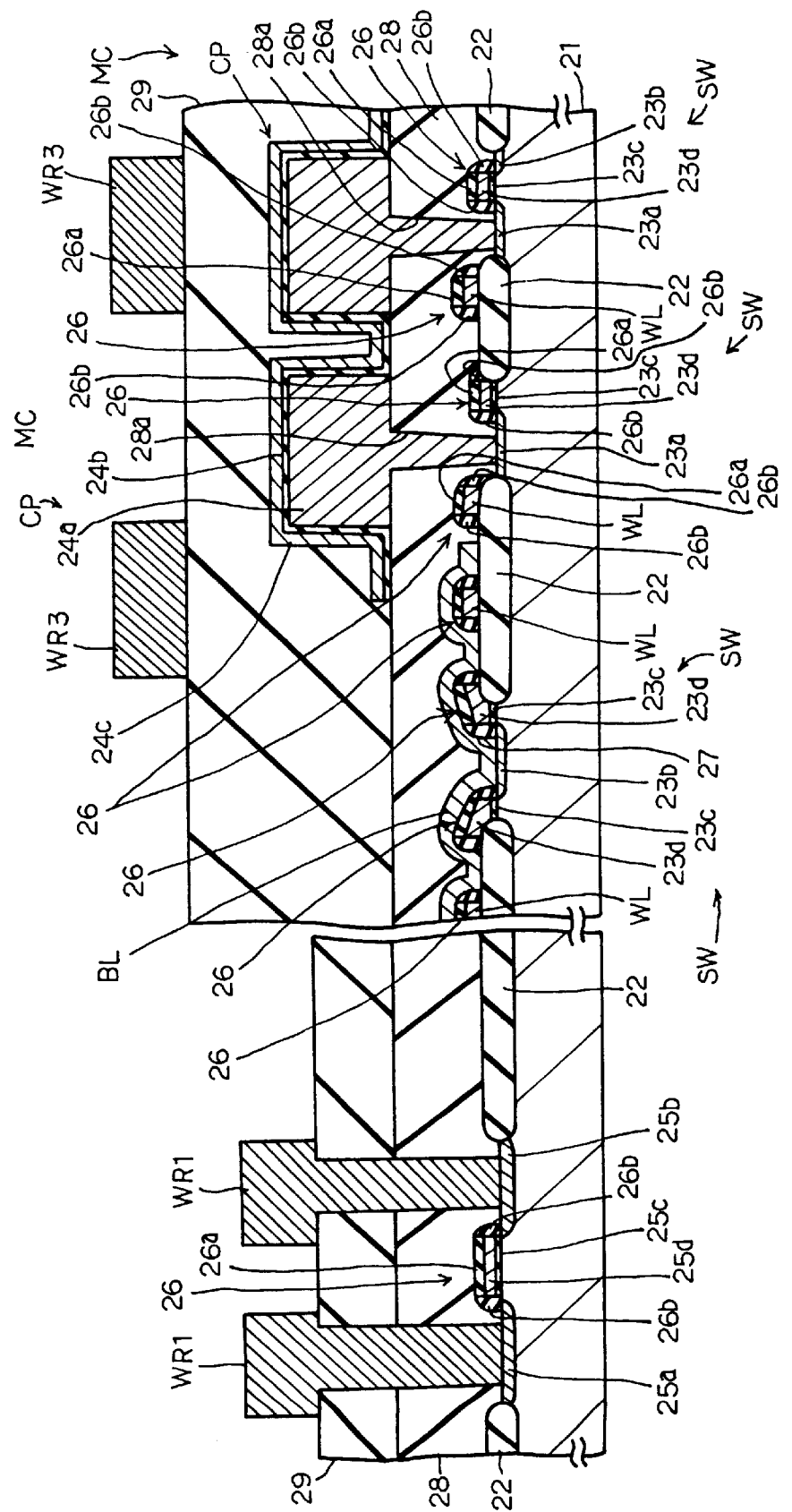
FIG. 4 is a cross sectional view taken along line A—A of FIG. 3 and showing the structure of the semiconductor dynamic random access memory device.

Referring first to FIGS. 3 and 4 of the drawings, a semiconductor dynamic random access memory device embodying the present invention is fabricated on a p-type silicon substrate 21. The major surface of the p-type silicon substrate 21 is imaginarily divided into section I and section II, and a field oxide layer 22 defines narrow active areas 21a and wide active areas 21b in these sections. The active areas 21a are parallelogram, and obliquely extend.

The semiconductor dynamic random access memory device comprises a memory cell array and peripheral circuits. The memory cell array is assigned to section I, and peripheral circuits are assigned to section II. The memory cell array stores data bits, and the peripheral circuits write data bits into and read out the data bits from the memory cell array.

A plurality of memory cells MC form the memory cell array, and a pair of memory cells MC is assigned to each narrow active area 21a. An n-channel enhancement type switching transistor SW is connected in series to a stacked storage capacitor CP, and the n-channel enhancement type switching transistor SW and the stacked storage capacitor CP as a whole constitute each of the memory cells MC.

Various circuit components, such as field effect transistors FET1 and FET2 fabricated on the wide active areas 21b form the peripheral circuits.

The n-channel enhancement type switching transistor SW includes an n-type source region 23a, an n-type common drain region 23b spaced from the n-type source region 23a, a gate insulating layer 23c grown on the active area between the n-type source region 23a and the n-type common drain region 23b and a gate structure 23d. The gate electrode 23d is a part of a word line WL, and the word line WL extending in parallel to one another (see FIG. 3). The word lines WL are connected to one of the peripheral circuits known as a row address decoder/word line driver unit, and the row address decoder/word line driver unit selectively changes the word lines WL to an active high level.

The n-type common drain region 23b is shared between the memory cells MC assigned to the same narrow active area 21a, and bit lines BL extend in parallel to one another. In this instance, the bit lines BL are formed of WSix where x is about 2. The bit line BL is held in contact with the n-type common drain region 23b, and the bit lines BL are connected to one of the peripheral circuits known as a sense amplifier circuit. Adjacent two bit lines BL form a bit line pair, and the sense amplifier circuit increases a potential difference on the bit line pair.

The n-type source region 23a is electrically connected to the stacked storage capacitor CP, and the storage capacitor CP includes a storage node electrode 24a, a dielectric layer 24b covering the storage node electrode 24a and a cell plate electrode 24c opposed through the dielectric layer 24b to the storage node electrode 24a. The storage node electrode 24a accumulates electric charge supplied from the bit line BL through the associated n-channel enhancement type switching transistor SW, and the accumulated electric charge generates the potential difference on the associated bit line pair.

The n-type dopant impurity is lightly doped into the n-type source/common drain regions 23a/23b, and only small amount of leakage current flows across the p-n junctions under a reverse biasing condition.

The field effect transistor FET1 includes n-type source/drain regions 25a and 25b spaced apart from each other by a channel region, a gate insulating layer 25c grown on the channel region and a gate electrode 25d formed on the gate insulating layer 25c. The n-type source/drain regions 25a/25b have an LDD (Lightly Doped Drain) structure, and the LDD structure is effective against hot carriers. The gate electrode 25d forms a part of control line 25e. Metal wirings WR1 are held in contact with the n-type source/drain regions 25a/25b, and another metal wiring WR2 is provided for the field effect transistors FET1/FET2. These metal wirings WR1/WR2 cause the field effect transistors FET1 and FET2 to cooperate with other circuit components. The metal wirings WR1 may be formed of aluminum or aluminum alloy, and the metal wirings WR1 is formed from a tungsten silicide layer (not shown) together with the bit lines BL.

The field effect transistor FET2 is similar in arrangement to the field effect transistor FET1, and these field effect transistors FET1 and FET2 are expected to drive a large amount of current.

The semiconductor dynamic random access memory device further comprises a plurality of insulating wall structures 26, and the word lines WL and the control line 25e are encapsulated in the insulating wall structures 26, respectively. The insulating wall structure 26 has an upper insulating wall 26a covering an upper surface of the word line WL and side insulating walls 26b, and the upper insulating wall 26a and the side insulating walls 26b extend along the word line WL and the control line 25e.

Figure 1:
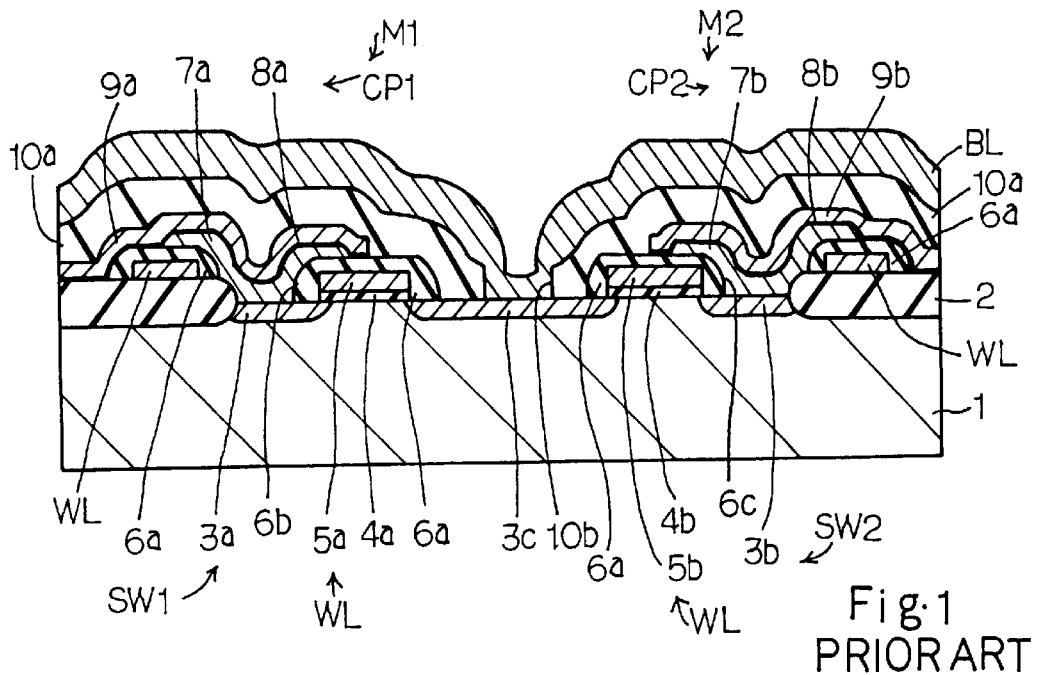
FIG. 1 is a cross sectional view showing the structure of the first prior art semiconductor dynamic random access memory device.

The insulating wall structures 26 are spaced apart from one another and form contact windows 27 therebetween. The bit lines BL extend on the insulating wall structure 26 and the field oxide layer 22, and are held in contact through the contact windows 27 with the n-type common drain regions 23b. When the word lines WL and the control lines 25e are encapsulated in the insulating wall structures 26, the contact windows 27 take place therebetween. In other words, the contact windows 27 are not formed by using lithographic techniques, and do not require a nesting tolerance. For this reason, the active areas 21a are narrower than the active area of the prior art semiconductor dynamic random access memory device shown in FIG. 1.

Figure 2:
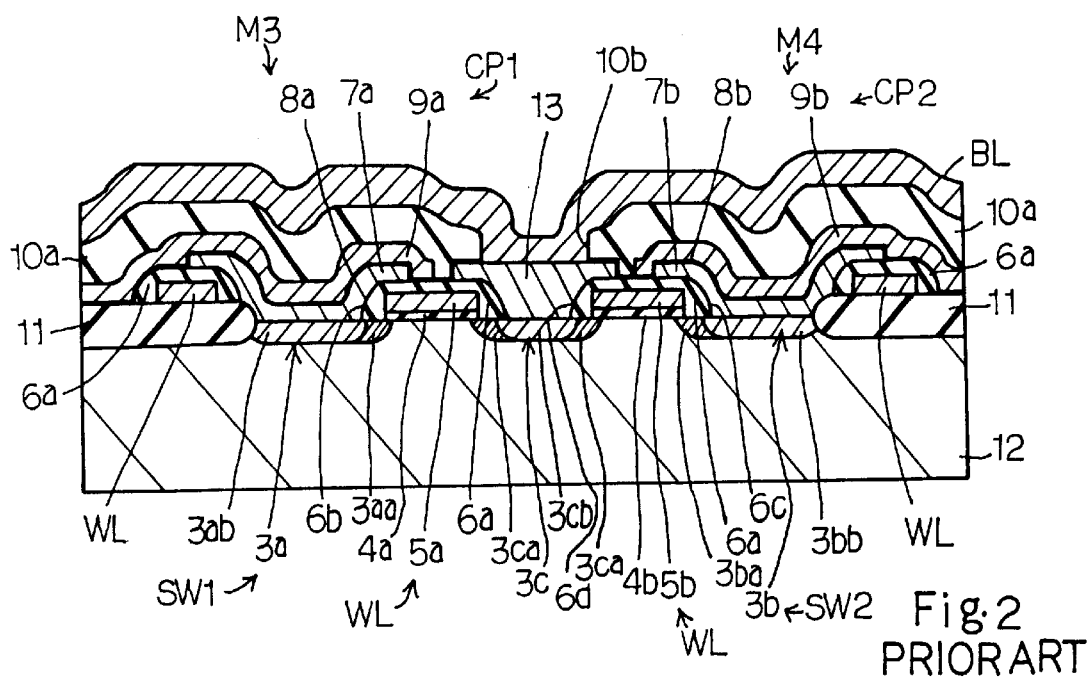
FIG. 2 is a cross sectional view showing the structure of the second prior art semiconductor dynamic random access memory device.

Moreover, the bit lines BL are directly held in contact with the n-type common drain regions 23b, and the contact resistance is decreased rather than that of the prior art semiconductor dynamic random access memory device shown in FIG. 2.

The insulating wall structures 26 and the bit lines BL are covered with a first inter-level insulating layer 28, and node contact holes 28a are formed in the first inter-level insulating layer 28. The node contact holes 28a expose the n-type source regions 23a, and the storage node electrodes 24a pass through the node contact holes 27a so as to reach the n-type source regions 23a. Although the first-inter-level insulating layer 28 is removed from the structure shown in FIG. 3 so as to expose the bit lines, the positions of the node contact holes 28a are latched for the sake of clear discrimination.

The stacked storage capacitors CP are formed on the first inter-level insulating layer 28, and are covered with a second inter-level insulating layer 29. The second inter-level insulating layer 29 is different in thickness between the section I and the section II, and the metal wirings WR1 and other aluminum wirings WR3 extend on the second inter-level insulating layer 29. The second inter-level insulating layer 29 and the metal wirings WR1/WR3 are also removed from the structure shown in FIG. 3. However, rectangular marks represent the positions of the metal wirings WR1/WR3, and are labeled with the same references WR1/WR3. Contact holes are formed in the first and second inter-level insulating layers 28/29, and the metal wirings WR1 are held through the contact holes with the impurity regions 25a and 25b.

The semiconductor dynamic random access memory device is fabricated as follows. FIGS. 5A to 5E, FIGS. 6A to 6E and FIGS. 7A to 7E illustrate a process sequence for fabricating the semiconductor dynamic random access memory device.

Figure 5A:
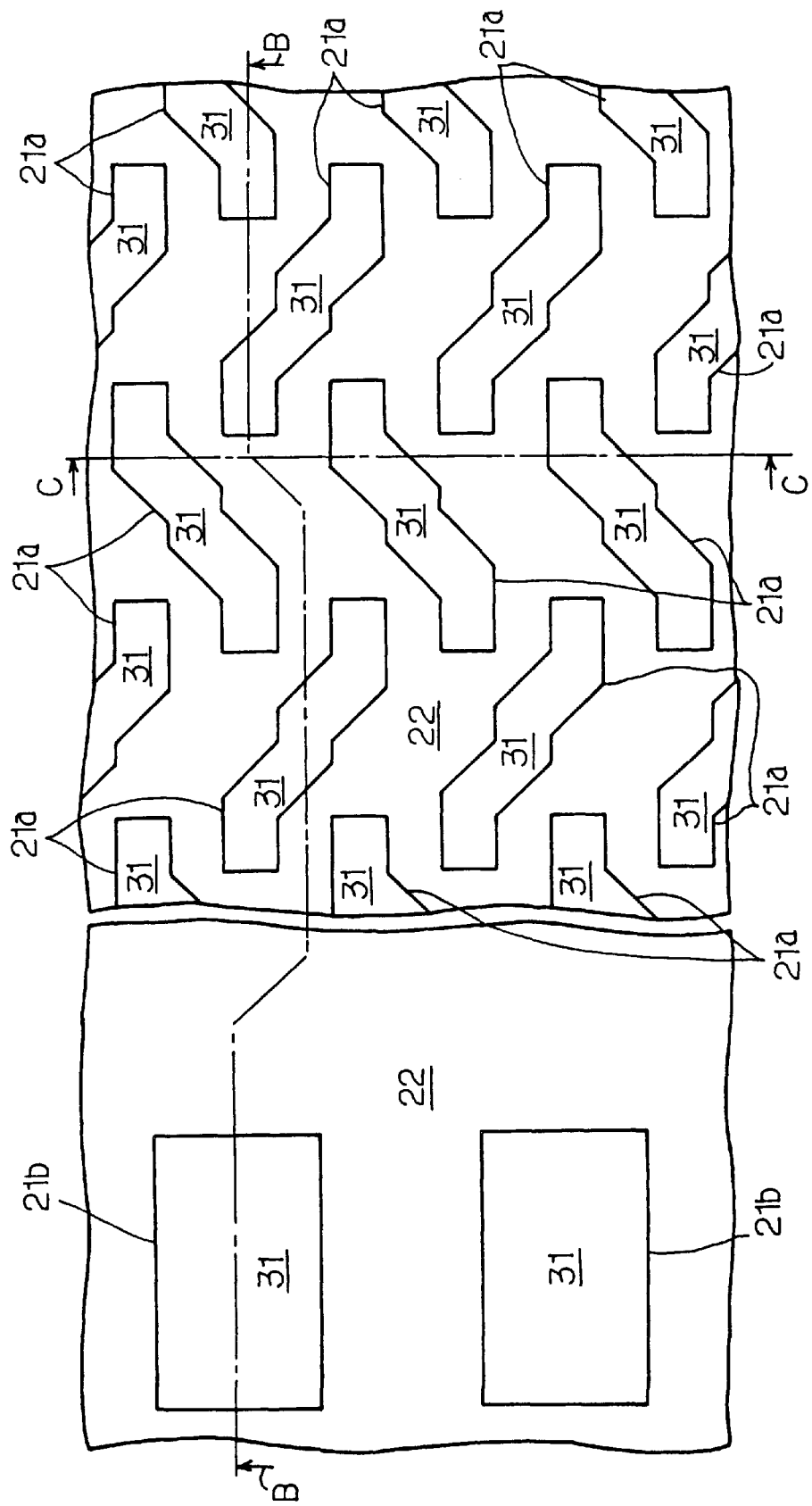
Figure 6A:
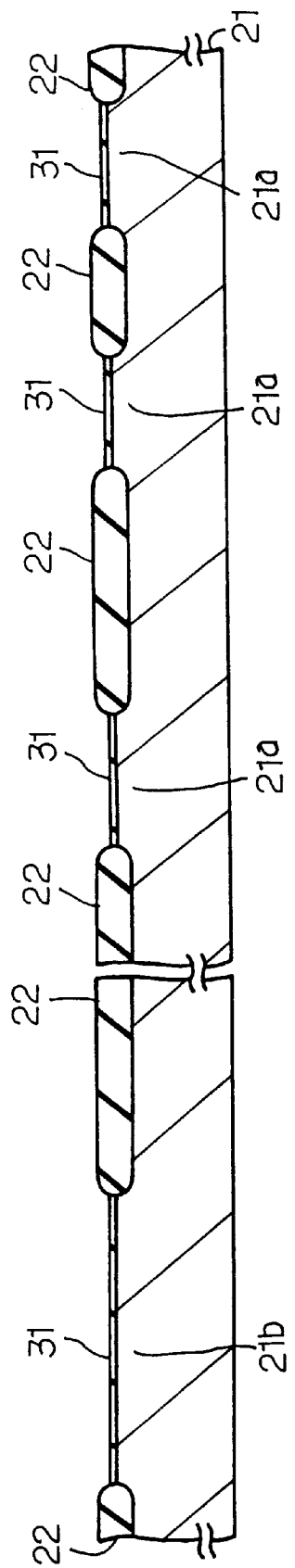
Figure 7A:
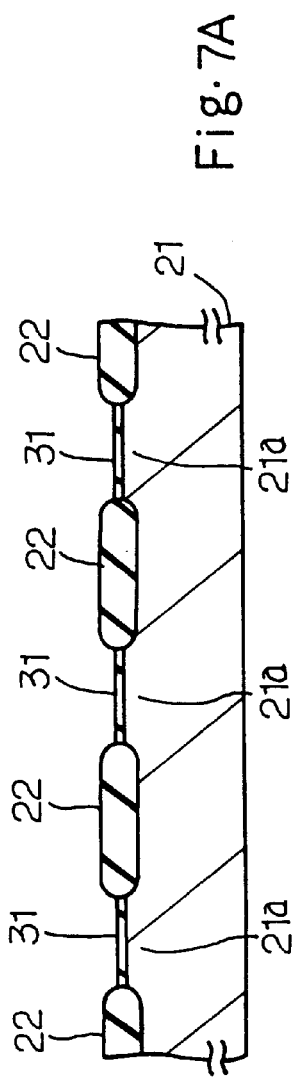

The process sequence starts with preparation of the p-type silicon substrate 21, and the field oxide layer 22 is selectively grown on sections I and II of the p-type silicon substrate 21. The field oxide layer 22 defines the narrow active areas 21a in section I and the wide active areas 21b in section II. The p-type silicon substrate 21 is placed in oxidizing ambience, and thin silicon oxide layers 31 are thermally grown on the narrow active areas 21a and the wide active areas 21b as shown in FIGS. 5A, 6A and 7A.

Subsequently, polysilicon is deposited over the entire surface of the resultant structure shown in FIGS. 5A, 6A and 7A. A refractory metal silicide may be further deposited over the polysilicon layer. Silicon oxide is deposited to 100 nanometers thick over the polysilicon layer or the lamination of the polysilicon layer and the refractory metal silicide layer, and the polysilicon layer or the lamination is overlain by a silicon oxide layer.

A photo-resist etching mask (not shown) is formed on the silicon oxide layer by using lithographic techniques, and the silicon oxide layer, the polysilicon layer/the lamination and the silicon oxide layer 31 are respectively patterned to the upper insulating walls 26a, the word lines/control line WL/25e and the gate insulating layers 23c/25c.

Figure 5B:
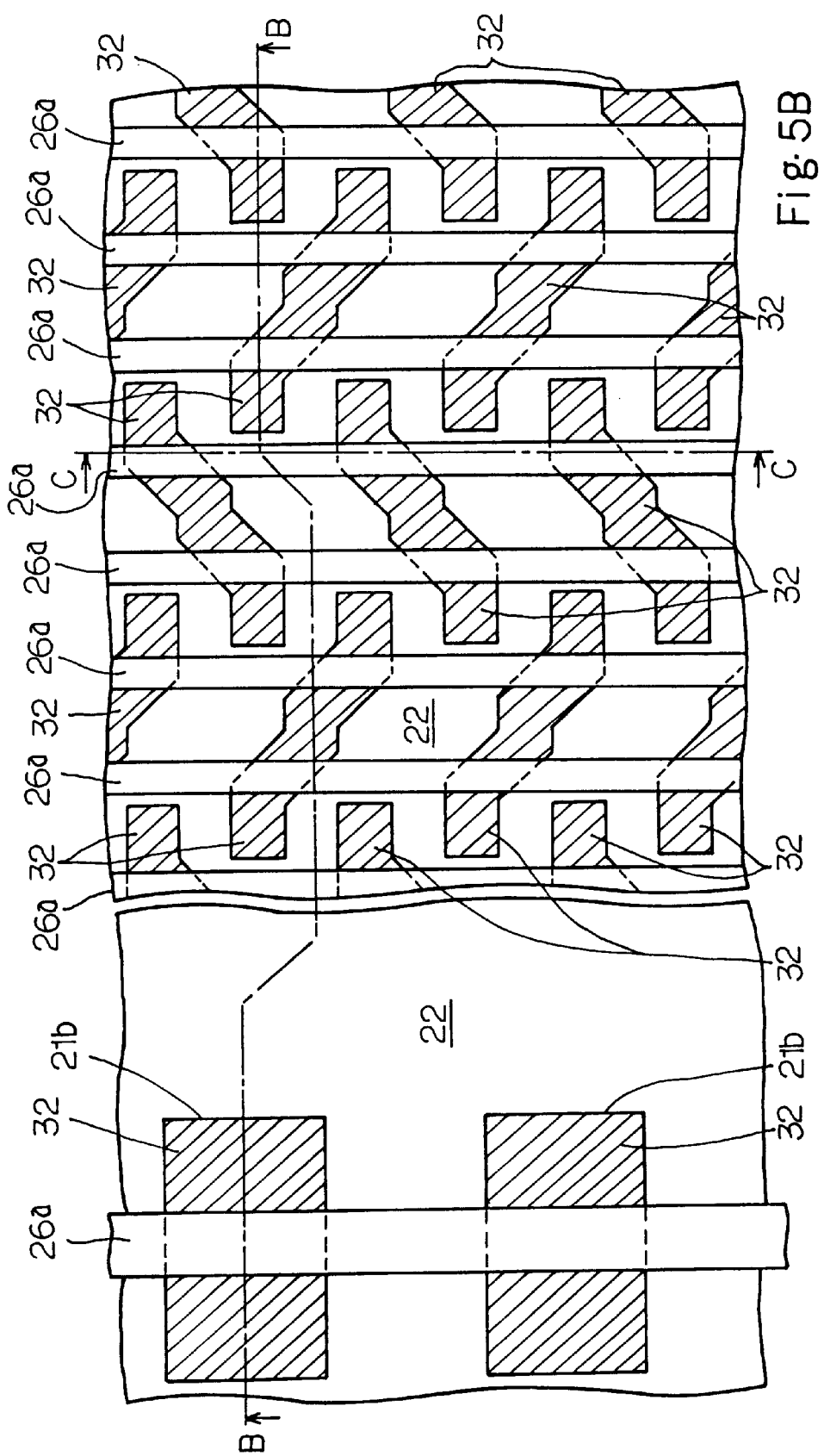

The p-type silicon exposed to the active areas 21a/21b are thermally oxidized, and the narrow active areas 21a and the wide active areas 21b are covered with thin silicon oxide layers (not shown). N-type dopant impurity is ion implanted into the narrow active areas 21a and the wide active areas 21b, and lightly doped n-type impurity regions 32 are formed in the narrow active areas 21a and the wide active areas 21b as shown in FIGS. 5B, 6B and 7B. The n-type impurity regions 32 in the narrow active areas 21a serve as the n-type source regions 23a and the n-type common drain regions 23b. The n-type impurity regions 32 are hatched in FIG. 5B for clear discrimination.

Subsequently, silicon oxide is deposited over the entire surface of the structure shown in FIGS. 5B, 6B and 7B so as to form a silicon oxide layer, and the silicon oxide layer is anisotropically etched without an etching mask. As a result, the side insulating walls 26b are left on the side surfaces of the word lines/the control line WL/25e. The silicon oxide layers on the lightly doped n-type regions 32 are removed during the anisotropic etching.

The upper insulating walls 26a and the side insulating walls 26b form in combination the insulating wall structures 26, ard the word line WL and the control line 25e are encapsulated in the insulating wall structures 26. Thus, a mask alignment step is not incorporated in the fabrication of the insulating wall structures 26, and the manufacturer does not take a nesting tolerance into account.

Figure 5C:
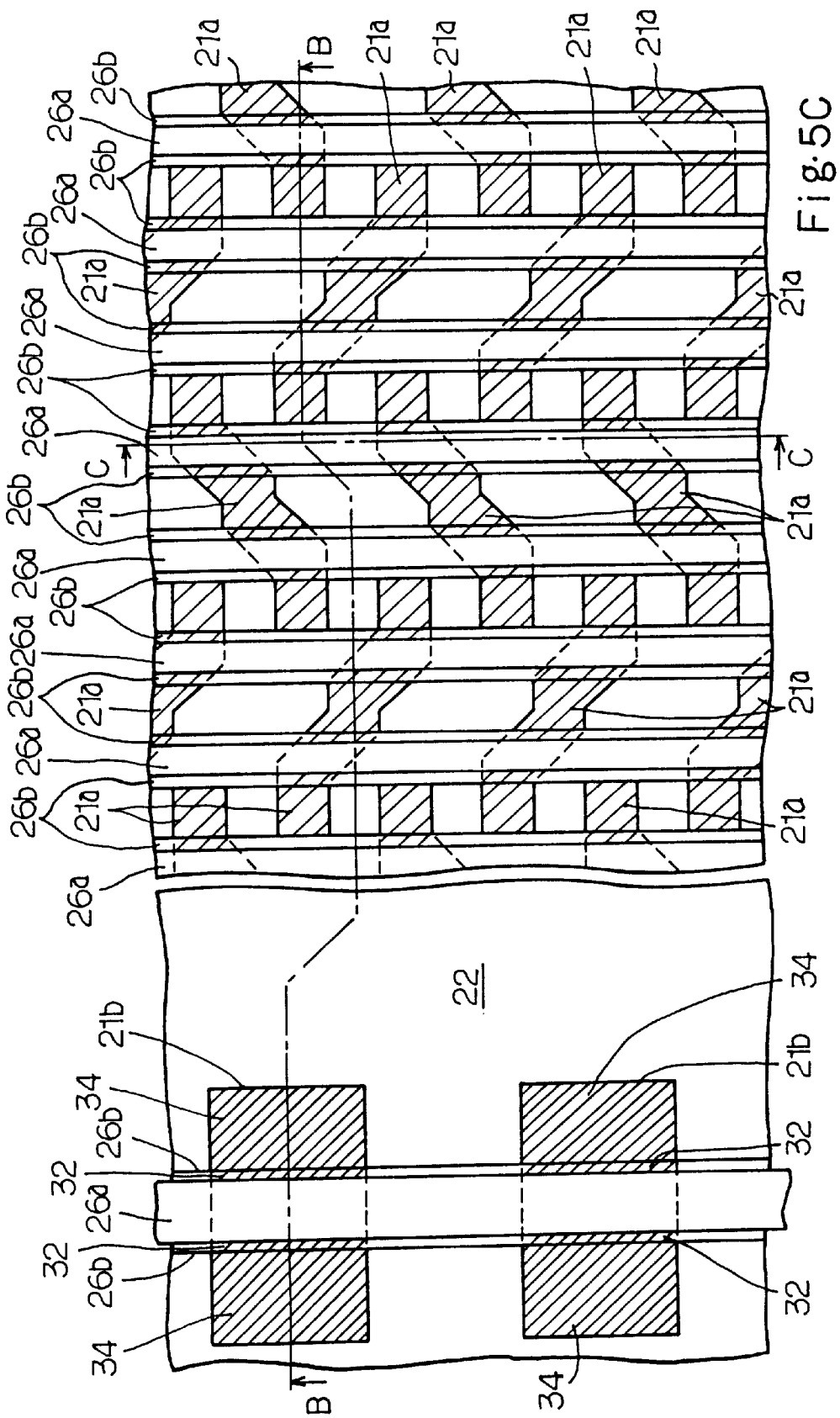
Figure 6C:
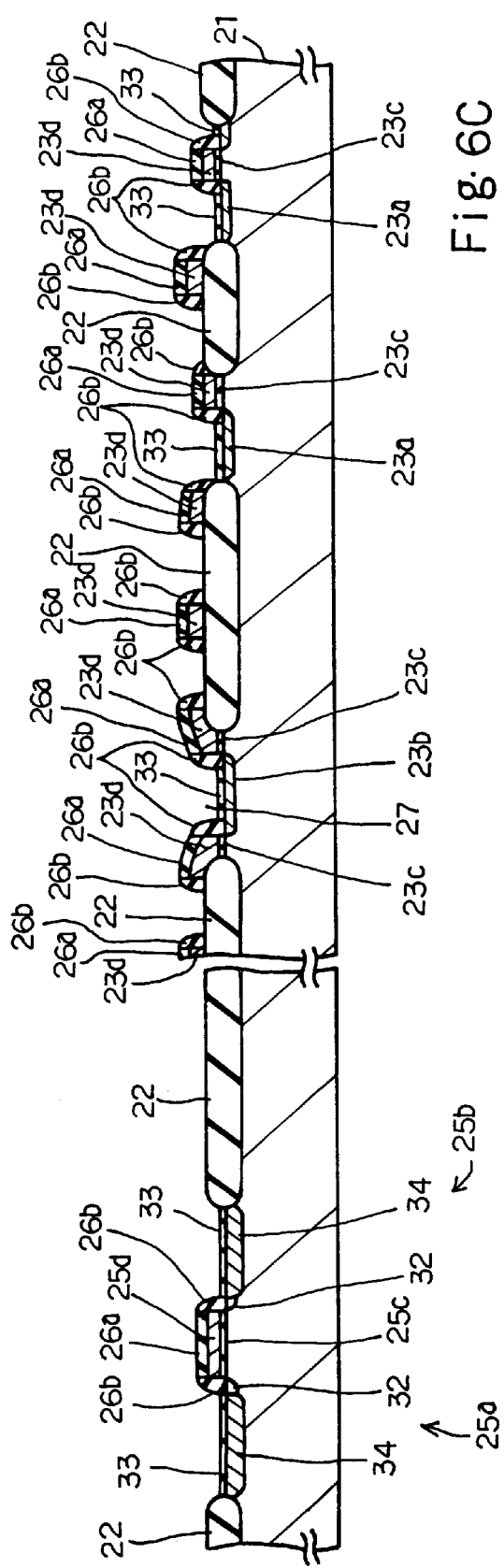
Figure 7C:
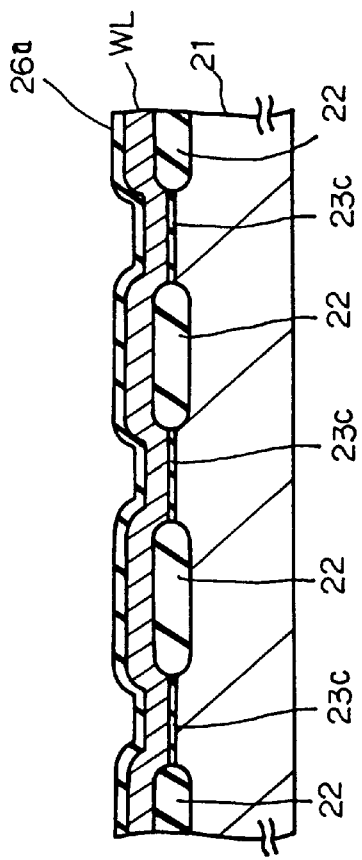

Subsequently, thin silicon oxide layer 33 is thermally grown to 20 nanometers thick on the lightly doped n-type regions 32, and a photo-resist mask (not shown) is formed over the section I. N-type dopant impurity is ion implanted into the wide active areas 21b, and forms heavily doped n-type regions 14. The heavily doped n-type regions 34 are hatched at small intervals in FIG. 5. The lightly doped n-type regions 32 and the heavily doped n-type regions 34 form in combination the LDD structure for the field effect transistors FET1/FET2. However, the photo-resist mask prevents the narrow active areas 21a from the ion implantation, and the n-type source regions 23a and the n-type common drain regions 23b remain lightly doped. After the ion implantation, the photo-resist mask is stripped off, and the resultant structure is illustrated in FIGS. 5C, 6C and 7C.

Subsequently, the silicon oxide layers 33 are etched away from the n-type source region 23a and the n-type common drain region 23b. However, a photo-resist mask (not shown) prevents the silicon oxide layer 33 on the wide active area 21b not held in contact with the metal wiring WR2 from the etchant. Although the photo-resist mask is patterned on the wide active area 21b, the area for the nesting tolerance is ignoreable.

The etchant exposes the n-type source regions 23a and the n-type common drain regions 23b to the contact windows 27, and a mis-alignment of the photo-resist mask (not shown) on the wide active area 21b does not affect the n-type source region 23a and the n-type common drain region 23b.

Figure 5D:
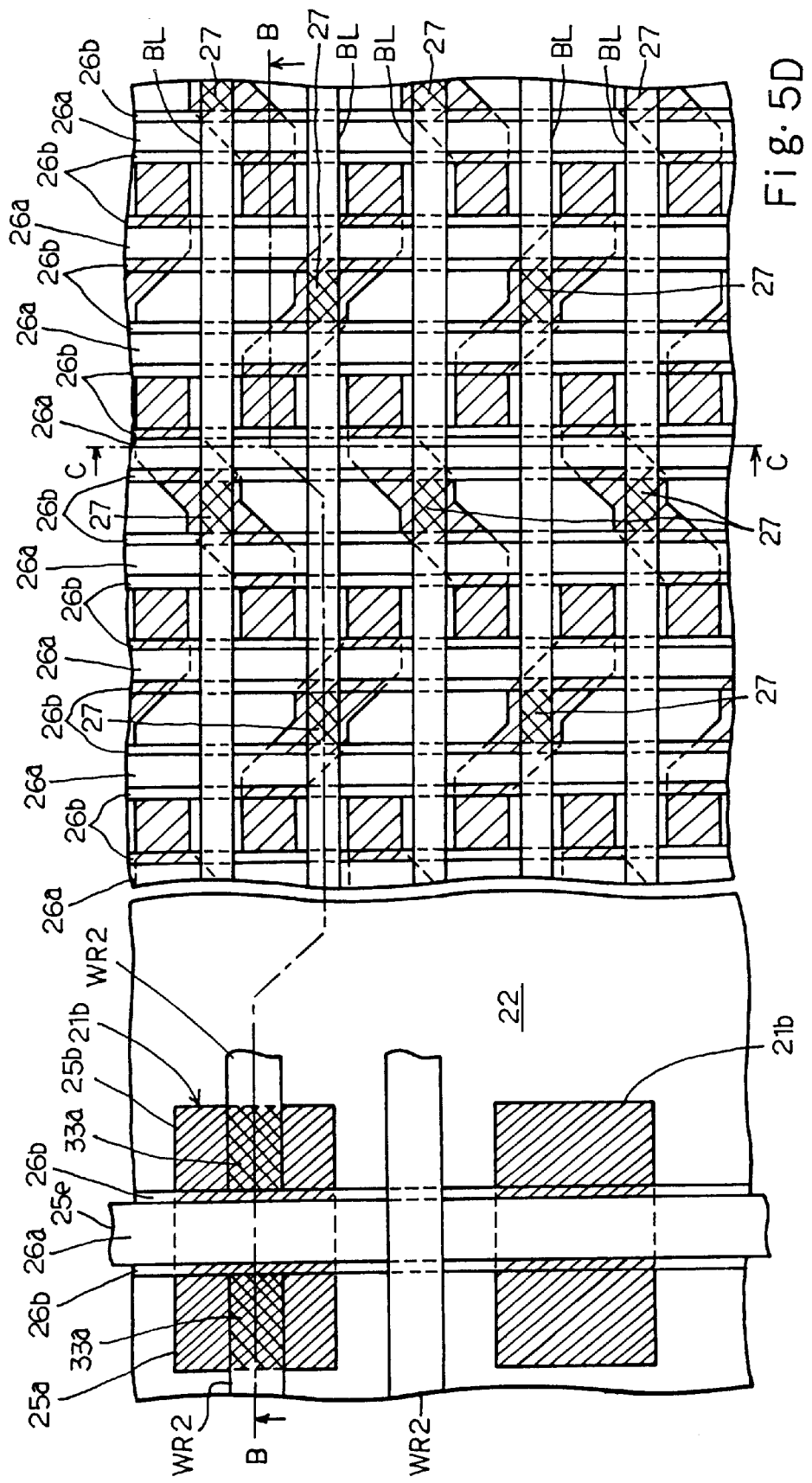
Figure 6D:
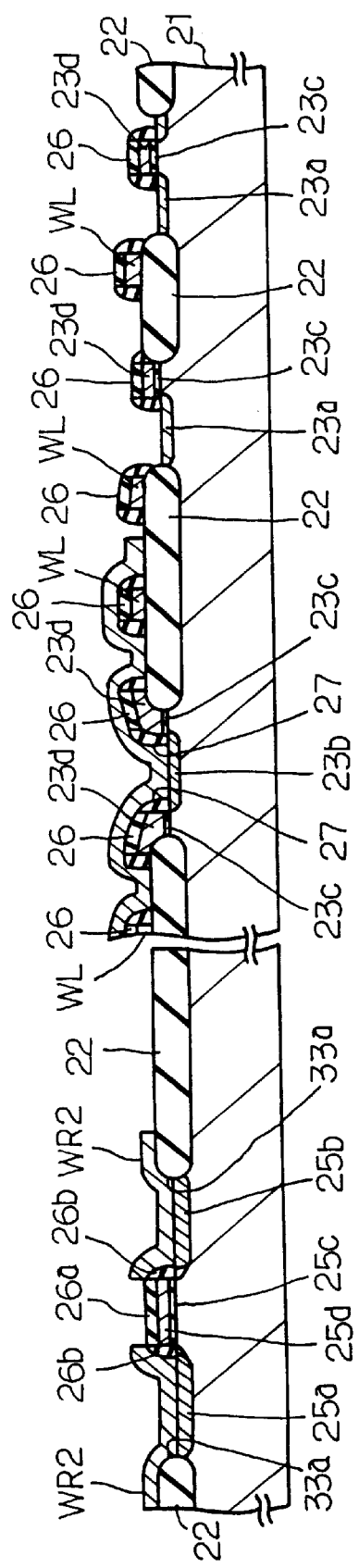
Figure 7D:
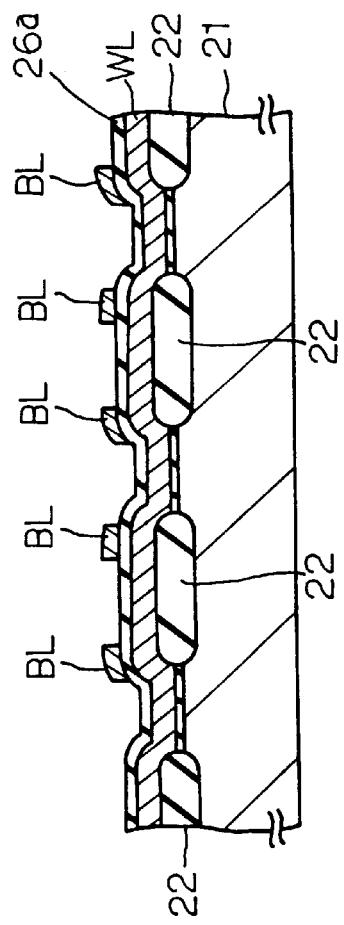

Subsequently tungsten silicide WSix is deposited to 100 nanometers thick over the entire surface, and the tungsten silicide layer is patterned to the bit lines BL and the metal lines WR2 as shown in FIGS. 5D, 6D and 7D. Gaseous etchant containing $Cl_2$ is available for the etching step for the tungsten silicide layer. The gaseous etchant does not etch the silicon oxide and the silicon, and forms the bit lines BL and the metal lines WR2. The silicon oxide layer 33 still covers the wide active areas 21b except for the contact holes 33a, and prevents the n-type source/drain regions 25a/25b from the gaseous etchant.

The bit lines BL are held in contact through the contact windows 27 to the n-type common drain regions 23b, and the positions of the contact windows 27 are netted in FIG. 5D. The metal line WR2 is held in contact through the contact holes with the n-type source and drain regions 25a/25b, and the contact holes are also netted in FIG. 5D.

The insulating wall structures 26 electrically isolates the word lines WL from the bit lines BL, and the bit lines BL form wide contacts with the n-type common drain regions 23b in a self-aligned manner. Thus, the bit lines BL are directly held in contact with the n-type common drain regions 23b, and the contact resistance is surely decreased.

The first inter-level insulating layer 28, and a photo-resist etching mask (not shown) is formed on the first inter-level insulating layer 28. The photo-resist mask (not shown) exposes upper areas of the first inter-level insulating layer 28 over the n-type source regions 23a to an etchant, and the contact holes 28a are formed in the first inter-level insulating layer 28. Polysilicon is deposited over the entire surface of the first inter-level insulating layer 28, and fills the contact holes 28a. A photo-resist etching mask (not shown) is formed on the polysilicon layer, and covers the area over the n-type source regions 23a. Using the photo-resist etching mask, the polysilicon layer is selectively etched away, and is patterned to the storage node electrodes 24a as shown in FIGS. 5E, 6E and 7E.

Subsequently the storage node electrodes 24a is covered with insulating material, and the insulating material is further covered with a conductive material. A photo-resist etching mask (not shown) is formed on the conductive material layer, and the conductive material layer and the insulating material layer are patterned to the dielectric layer 24b and the cell plate electrodes 24c.

The dielectric layer may be formed from a silicon film and/or a silicon nitride film.

The second inter-level insulating layer 29 is deposited over the entire surface of the structure, and aluminum alloy is sputtered on the second inter-level insulating layer 29. A photo-resist etching mask (not shown) is formed on the aluminum alloy layer, and the aluminum alloy layer is patterned to the metal wirings WR1 and WR3 as shown in FIGS. 3 and 4.

As will be appreciated from the foregoing description, the insulating wall structures 26 form the contact windows 27 without a photo-resist mask, and the insulating wall structures 26 are necessary for the LDD structure of the field effect transistors FET1/FET2 of the peripheral circuits. Therefore, the process sequence according to the present invention is highly compatible to the prior art process, and the direct contact between the bit lines BL and the n-type common drain regions 23b decreases the contact resistance.

Although particular embodiments of the present invention have been shown and described, it will be obvious to those skilled in the art that various changes and modifications may be made without departing from the spirit and scope of the present invention.

For example, the insulating wall structure may be formed from silicon nitride layers or other insulating layers. The gate structure may have a salicide structure, and the refractory metal silicide is not limited to the tungsten silicide.

Moreover, the semiconductor dynamic random access memory device according to the present invention may form an ultra large scale integration together with other function blocks.

What is claimed is:

1. A semiconductor memory device fabricated on a semiconductor substrate, comprising:
   a memory cell array including a plurality of memory cells each having a switching transistor and a storage capacitor electrically connected in series, said switching transistor having a source region formed in a first surface portion of said semiconductor substrate and electrically connected to said storage capacitor via an accumulating electrode, a drain region formed in a second surface portion of said semiconductor substrate and spaced from said source region, a first gate insulating layer formed on a third surface portion of said semiconductor substrate between said source region and said drain region and a first gate structure formed on said first gate insulating layer;
   a plurality of insulating wall structures each contacting a gate structure and defining contact windows between adjacent insulating wall structures, at least a portion of said drain region being exposed between adjacent insulating wall structures;
   at least one bit line extending over said insulating wall structures, said bit line being in direct contact with a plurality of said wall structures and, through one of said contact windows, with said drain region; and
   a first inter-level insulating layer covering said insulating wall structures and said bit lines,
   wherein said bit line and said accumulating electrode are made of a first and a second low-resistive material, respectively.

2. The semiconductor memory device as set forth in claim 1, further comprising
   at least one field effect transistor forming a part of a peripheral circuit, and having a second gate insulating layer formed on a fifth surface portion of said semiconductor substrate, a second gate structure formed on said second gate insulating layer and encapsulated in one of said plurality of insulating wall structures, a lightly doped source region formed in a fourth surface portion of said semiconductor substrate in a self aligned manner with said second gate structure, a heavily doped source region nested in said lightly doped source region in a self-aligned manner with said one of said plurality of insulating wall structures, a lightly doped drain region formed in a sixth surface portion of said semiconductor substrate in said self aligned manner with said second gate structure and a heavily doped drain region in said self-aligned manner with said one of said plurality of insulating wall structures.

3. The semiconductor memory device as set forth in claim 2, in which said lightly doped source region and said lightly doped drain region form a lightly doped drain structure together with said heavily doped source region and said heavily doped drain region, and said source region and said drain region of said switching transistor are roughly equal in dopant concentration to said lightly doped source region and said lightly doped drain region.

4. The semiconductor memory device as set forth in claim 1, wherein said storage capacitor is a stacked storage capacitor fabricated on said first inter-level insulating layer and covered with a second inter-level insulating layer.

5. The semiconductor memory device as set forth in claim 1 wherein said first material is primarily WSi, and said second material is primarily polysilicon.

6. A semiconductor memory device comprising:
   a semiconductor substrate;
   a first word line formed on said semiconductor substrate and extending in a first direction;
   a second word line formed on said semiconductor substrate and extending in said first direction;
   a bit line formed on said semiconductor substrate and extending in a second direction perpendicular to said first direction;
   an active region formed in said semiconductor substrate and extending diagonally to said first and second directions, said first and second word lines and said bit line running over said active region, said active region having a first end portion located on one side of said bit line, and a second end portion located on another side of said bit line;
   a diffusion region formed in said active region and located between said first and second word lines, said diffusion region being coupled to said bit line;

a first capacitor located in said first end portion of said active region;

a second capacitor located in said second end portion of said active region;

a first transistor formed in said active region and located between said first capacitor and said diffusion region and having a first control gate coupled to said first word line operatively to connect said first capacitor and said diffusion region;

a second transistor formed in said active region and located between said second capacitor and said diffusion region and having a second control gate coupled to said second word line operatively to connect said second capacitor and said diffusion region;

a plurality of insulating walls each wrapping said first and second word lines, thereby defining contact window exposing said diffusion region;

wherein said bit line extends between said first and second capacitors and on said diffusion region and said insulating walls, and is in direct contact with said diffusion region through said insulating walls.

7. The semiconductor memory device as set forth in claim 6, comprising:

a memory cell array including a first and a second memory cell, said first memory cell having said first transistor and said first capacitor electrically connected in series, said second memory cell having said second transistor and said second capacitor electrically connected in series, said first transistor having a first source region formed in said first end portion of said active region and electrically connected to said first capacitor via a first accumulating electrode, a first drain region formed in said diffusion region and spaced from said first source region, a first gate insulating layer formed on a first surface portion of said semiconductor substrate between said first source region and said first drain region, and said first control gate formed on said first gate insulating layer, said second transistor having a second source region formed in said second end portion of said active region and electrically connected to said second capacitor via a second accumulating electrode, a second drain region formed in said diffusion region and spaced from said second source region, a second gate insulating layer formed on a second surface portion of said semiconductor substrate between said second source region and said second drain region, and said second control gate formed on said second gate insulating layer, said plurality of insulating walls each contacting said first and second control gates and defining contact windows between adjacent insulating walls, at least a portion of said diffusion region being exposed between said adjacent insulating walls, said bit line extending over said insulating walls, said bit line being in direct contact with said plurality of said insulating walls and, through one of said contact windows, with said diffusion region; and a first inter-level insulating layer covering said insulating walls and said bit line, wherein said bit line and at least one of said first and second accumulating electrodes are made of a first and a second low-resistive material, respectively.

8. The semiconductor memory device as set forth in claim 6, further comprising:

at least one field effect transistor forming a part of a peripheral circuit, and having a third gate insulating layer formed on a fifth surface portion of said semiconductor substrate, a third gate structure formed on said third gate insulating layer and encapsulated in one of said plurality of insulating walls, a lightly doped source region formed in a fourth surface portion of said semiconductor substrate in a self aligned manner with said third gate structure, a heavily doped source region nested in said lightly doped source region in a self-aligned manner with said one of said plurality of insulating walls, a lightly doped drain region formed in a sixth surface potion of said semiconductor substrate in said self aligned manner with said third gate structure and a heavily doped drain region in said self-aligned manner with said one of said plurality of insulating walls.

9. The semiconductor memory device as set forth in claim 8, in which said lightly doped source region and said lightly doped drain region form a lightly doped drain structure together with said heavily doped source region and said heavily doped drain region, said first and second source and drain regions of said first and second transistors are roughly equal in dopant concentration to said lightly doped source region and said lightly doped drain region.

10. The semiconductor memory device as set forth in claim 6, wherein at least one of said first and second capacitors is a stacked storage capacitor fabricated on a first inter-level insulating layer and covered with a second inter-level insulating layer.

11. The semiconductor memory device as set forth in claim 6, wherein said bit line is made primarily of WSi, and accumulating electrodes of said first and second capacitors are made primarily of polysilicon.

12. A semiconductor memory device comprising:

a plurality of word lines each extending in a first direction;

a plurality of bit lines each extending in a second direction perpendicular to said first direction;

a plurality of active areas each extending diagonally to said first and second directions, each of said active areas overlapping adjacent two word lines of said plurality of word lines and one bit line of said plurality of bit lines, each of said active areas having a first portion, a second portion, and a third portion located between said first and second portions, said first portion located on one side of said one bit line of said plurality of bit lines such that one word line of said adjacent two word lines is located between said first and third portions, said second portion located on other side of said one bit line of said plurality of bit lines such that another word line of said adjacent two word lines is located between said second and third portions, said third portion being located between said two word lines;

a first capacitor group located on a first line running in said first direction, said first capacitor group having a plurality of first capacitors, each of said first capacitors located on said first portion of each of said active areas;

a second capacitor group located on a second line running in said first direction, said second capacitor group having a plurality ol second capacitors, each of said second capacitors located on said second portion of each of said active areas;

a plurality of diffusion regions, each of said diffusion regions located in said third portion of each of said active areas;

a plurality of first transistors, each of said first transistors located in each of said active areas operatively to connect each of said first capacitors and each of said diffusion regions, respectively, each of said first transistors having a first control gate coupled to said one of said adjacent two word lines;

a plurality of second transistors, each of said second transistors located in each of said active areas operatively to connect each of said second capacitors and each of said diffusion regions, respectively, each of said second transistors having a second control gate coupled to said another of said adjacent two word line;

a plurality of insulating walls each wrapping said plurality of word lines, thereby defining contact window exposing each of said diffusion regions;

wherein said active areas are arranged such that, active areas including even numbered capacitors of said first capacitor group are at an angle with said first direction at one side of said first line defined by said first capacitor group, active areas including odd numbered capacitors of said first capacitor group, are arranged at said angle with said first direction at another side of said first line defined by said first capacitor group, and said one bit line extends between said first and second capacitors of each of said active areas, extends on said diffusion regions and said insulating walls of each of said active areas, and is in direct contact with said diffusion regions of each of said active areas through said insulating walls, respectively.

13. The semiconductor memory device as set forth in claim 12, comprising:

a memory cell array including first and second memory cells, said first memory cells having said first transistors and said first capacitors electrically connected in series, respectively said second memory cells having said second transistors and said second capacitors electrically connected in series, respectively, each of said first transistors having a first source region formed in said first portion and electrically connected to each of said first capacitors via first accumulating electrodes, respectively, a first drain region formed in said third portion and spaced from said first source region, a first gate insulating layer formed between said first source region and said first drain region, and said first control gate formed on said first gate insulating layer, each of said second transistors having a second source region formed in said second portion and electrically connected to each of said second capacitors via second accumulating electrodes, respectively, a second drain region formed in said third portion and spaced from said second source region, a second gate insulating layer formed between said second source region and said second drain region, and said second control gate formed on said second gate insulating layer, said plurality of insulating walls each contacting said first and second control gates and defining contact windows between adjacent insulating walls, at least a portion of said third portion being exposed between said adjacent insulating walls, said one bit line extending over said insulating walls, said one bit line being in direct contact with said plurality of said insulating walls and, through one of said contact windows, with said third portion; and a first inter-level insulating layer covering said insulating walls and said bit lines, wherein said at least one bit line and at least one of said first and second accumulating electrodes are made of a first and a second low-resistive material, respectively.

14. The semiconductor memory device as set forth in claim 12, further comprising:

at least one field effect transistor forming a part of a peripheral circuit, and having a third gate insulating layer formed on a fifth surface portion of said semiconductor substrate, a third gate structure formed on said third gate insulating layer and encapsulated in one of said plurality of insulating walls, a lightly doped source region formed in a fourth surface portion of said semiconductor substrate in a self aligned manner with said third gate structure, a heavily doped source region nested in said lightly doped source region in a self-aligned manner with said one of said plurality of insulating walls, a lightly doped drain region formed in a sixth surface potion of said semiconductor substrate in said self aligned manner with said third gate structure and a heavily doped drain region in said self-aligned manner with said one of said plurality of insulating walls.

15. The semiconductor memory device as set forth in claim 14, in which said lightly doped source region and said lightly doped drain region form a lightly doped drain structure together with said heavily doped source region and said heavily doped drain region, said first and second source and drain regions of said first and second transistors are roughly equal in dopant concentration to said lightly doped source region and said lightly doped drain region.

16. The semiconductor memory device as set forth in claim 12, wherein at least one of said first and second capacitors is a stacked storage capacitor fabricated on a first inter-level insulating layer and covered with a second inter-level insulating layer.

17. The semiconductor memory device as set forth in claim 12, wherein said bit lines are made primarily of WSi, and accumulating electrodes of said first and second capacitors are made primarily of polysilicon.

* * * * *

UNITED STATES PATENT AND TRADEMARK OFFICE
CERTIFICATE OF CORRECTION

PATENT NO. : 5,973,343
DATED : October 26, 1999
INVENTOR(S) : Yoshihiro TAKAISHI It is certified that error appears in the above-identified patent and that said Letters Patent is hereby corrected as shown below:

Column 1, line 38, delete "c" and insert --3c--.

Column 3, line 21, delete "6d" and insert --6a--.

Column 3, line 22, delete "6a" and insert --6d--.

Column 8, line 19, delete "14" and insert --34--.

Signed and Sealed this

First Day of August, 2000

*Attest:*

Q. TODD DICKINSON

*Attesting Officer*   *Director of Patents and Trademarks*